United States Patent [19]

Honma

[11] Patent Number: 5,074,241
[45] Date of Patent: Dec. 24, 1991

[54] DEVELOPER MATERIAL COATING APPARATUS CARRY ROLLER

[75] Inventor: Yoshiyasu Honma, Nagoya, Japan

[73] Assignee: Brother Kogyo Kabushiki Kaisha, Nagoya, Japan

[21] Appl. No.: 497,658

[22] Filed: Mar. 23, 1990

[30] Foreign Application Priority Data

Apr. 4, 1989 [JP] Japan .................................. 1-85553

[51] Int. Cl.$^5$ ............................................. G03G 15/06
[52] U.S. Cl. ..................................... 118/651; 355/259;
118/638; 118/653
[58] Field of Search ............... 118/50.1, 621, 624–625,
118/638, 644, 647–649, 651–653, 661, 665–667,
669, 677–679; 355/245, 259, 265, 312

[56] References Cited

U.S. PATENT DOCUMENTS 4,122,210 10/1978 Gundlach ............................ 118/647
4,965,639 10/1990 Manno ................................ 118/653

Primary Examiner—Richard V. Fisher
Assistant Examiner—Charles K. Friedman
Attorney, Agent, or Firm—Oliff & Berridge

[57] ABSTRACT

A developer material coating apparatus comprising a developer material coating unit for triboelectrically charging the developer material and electrostatically supplying the charged developer material to the support member in the developer material coating region, the developer material coating unit including a carry roller rotatable around a rotational axis thereof for carrying thereon and feeding the charged developer material to the developer material coating region, and a support member feeding unit for feeding the support member to the developer material coating region while carrying the support member thereon, the support member feeding unit having a coating plane in the developer material coating region on which the support member is disposed so as to be electrostatically coated with the developer material and a guide unit for feeding the support member along the coating plane in a predetermined feeding direction, and wherein the carry roller is disposed at a predetermined interval away from the coating plane such that the direction of the rotational axis of the carry roller is intersected obliquely at a predetermined angle to the feeding direction of the support member on the coating plane of the support member feeding unit.

12 Claims, 2 Drawing Sheets

DEVELOPER MATERIAL COATING APPARATUS CARRY ROLLER

BACKGROUND OF THE INVENTION

This invention relates to a developer material coating apparatus for coating a support member such as a plain paper with granular developer material.

There has been recently utilized a color copying machine in which a color image is formed on a support member such as plain paper using granular developer material and a microcapsule sheet. A color image forming process of this type of color copying machine is as follows. A developer sheet is beforehand formed by coating the developer material on the support member such as plain paper, and the microcapsule sheet is exposed through an original to light to form a latent image on the microcapsule sheet. The microcapsule sheet having the latent image thereon and the developer sheet comprising the support member coated with the developer material are fed to a pressure-developing unit while contacted with each other under pressure. In the pressure-developing unit, the microcapsule sheet and the developer sheet are subjected to a pressure-developing process to develop the latent image on the microcapsule sheet into a visible color image on the developer sheet. Thereafter, the developer sheet having the visible color image thereon is fed to a heat-fixing unit to thermally fix the visible color image on the developer sheet. The developer material is formed of, for example, acid clay, binder and so on, and thus the developer sheet may comprise the support member coated with the developer material formed of the acid clay, the binder and so on.

As described above, this type of color copying machine requires a process for coating the developer material on the support member such as plain paper, and thus a coating apparatus therefor. As a coating apparatus, there has been conventionally used a coating apparatus in which the developer material on the support member is charged with triboelectrification and then is electrostatically coated on the support member.

FIG. 1 shows a conventional coating apparatus C for coating the developer material on the support member such as plain paper. This coating apparatus comprises, for example, a support member feeding unit for feeding the support member to a developer material coating region R in which the support member P is electrostatically coated with the developer material S and then discharging the support member coated with the developer material to an outside of the coating apparatus, and a developer material coating unit for triboelectrically charging the developer material and electrostatically supplying the charged developer material to the support member which has been fed to the developer material coating region R.

The developer material coating unit comprises a tank 50 for accommodating the developer material S therein, a rotatable carry roller 52 for carrying the developer material thereon and a rotatable supply roller 51 for triboelectrically charging the developer material in cooperation with the carry roller 52 and supplying the charged developer material to the carry roller 52. The carry roller 52 and the supply roller 51 are accommodated in the tank 50, and the carry roller 52 is grounded as shown in FIG. 1. The carry roller 52 and the supply roller 51 are rotatably contacted with each other at the peripheral surfaces thereof, and the developer material S is triboelectrically negatively charged at the contacted surfaces of the rollers 51 and 52 through friction between the surface of the carry roller 52 and the developer material S. The charged developer material S is attached to the peripheral surface of the carry roller 52 and then is fed to the developer material coating region R where the charged developer material S is electrostatically supplied from the developer material coating unit to the support member feeding unit.

The support member feeding unit comprises a counter electrode roller 53, which is supplied with a positive voltage from a D.C. power source, a pair of guide rollers 55 and 56 provided away from the counter electrode roller 53, a carry belt 54 such as an endless belt suspended among the counter roller 53 and the guide rollers 55 and 56 for feeding the support member to the developer material coating region while carrying the support member P thereon and discharging the support member coated with the developer material (developer sheet) to the outside of the coating apparatus, and a pushing roller 57 for pushing the support member P against the carry belt 54 to closely contact the support member P with the surface of the carry belt 54. As shown in FIG. 1, since the counter electrode roller 53 is supplied with the positive voltage and the carry roller 52 is grounded, an electric field occurs between the carry roller 52 and the counter electrode roller 53. The charged developer material S carried on the carry roller 52 is electrostatically attracted toward the counter electrode roller 53 with the electric field.

The operation of the developer material coating apparatus as shown in FIG. 1 will be described hereunder.

The support member P which is supplied through a sheet inlet (not shown) to the carry belt 54 of the developer material coating apparatus C while closely contacted with the carry belt 54 by the pushing roller 57, and fed to the developer material coating region R by the rotation of the counter roller 53 and the guide rollers 55 and 56. The negatively-charged developer material S on the carry roller 52 is electrostatically attracted toward the counter electrode roller 53 with the electric field. That is, negatively-charged particles of the developer material S are electrostatically attracted (flight) toward the counter electrode roller 53 in the developer material coating region R where the counter roller 53 and the carry roller 52 are most closely confronted to each other, and attach to the support member P to form a developer material layer 58 on the support member P, that is, a developer sheet. Thereafter, the developer sheet (the support member coated with the developer material 58) is discharged to the outside of the coating apparatus C, and is subjected to a pressure development while contacted with a microcapsule sheet under pressure.

In the conventional developer material coating apparatus thus constructed, the charged developer material S attached on the peripheral surface of the carry belt 52 is intactly transferred to the support member P contacted with the carry belt 54. Accordingly, when the developer material S is unevenly attached to the surface of the carry roller 52 due to unevenness of the surface shape of the carry roller 52, aggregation of the particles of the developer material S or the like (for example, when a striped irregularity of the developer material S occurs along the peripheral surface of the carry roller 52 as shown by irregular coating portions 3a to 3d in FIG. 3), the striped irregularity of the developer material S on the carry roller 52 is also intactly transferred to the surface of the support member P, that is, the developer material S is unevenly coated on the support member in a strip pattern. As a result, after the pressure development, a visible image having a striped irregularity in image density is formed on the support member P.

SUMMARY OF THE INVENTION

An object of this invention is to provide a developer material coating apparatus in which the developer material is evenly coated on the support member irrespective of an irregularity of the developer material S on the carry roller, thereby forming a visible image without irregularity in image density.

To attain the above object, the developer material coating apparatus according this invention in which developer material is electrostatically coated on a support member such as plain paper in a developer material coating region to form a developer sheet, comprises developer material coating means for triboelectrically charging the developer material and electrostatically supplying the charged developer material to the support member in the developer material coating region, the developer material coating means including a carry roller rotatable around a rotational axis thereof for carrying thereon and feeding the charged developer material to the developer material coating region, and support member feeding means for feeding the support member to the developer material coating region while carrying the support member thereon, the support member feeding means having a coating plane in the developer material coating region on which the support member is disposed so as to be electrostatically coated with the developer material and a guide unit for feeding the support member along the coating plane in a predetermined feeding direction, and wherein the carry roller is disposed at a predetermined interval away from the coating plane such that the direction of the rotational axis of the carry roller is intersected obliquely at a predetermined angle to the feeding direction of the support member on the coating plane of the support member feeding means.

The guide unit of the developer material coating apparatus according to this invention comprises a pair of rotatable electrode shafts and a carry belt suspended between the electrode shafts supplied with a voltage having the opposite polarity to that of the charged developer material for carrying the support member thereon, the coating plane being defined as the surface of the carry belt located between the electrode shafts.

DETAILED DESCRIPTION OF THE INVENTION

The preferred embodiment of this invention will be described hereunder with reference to the accompanying drawings.

Figure 2:
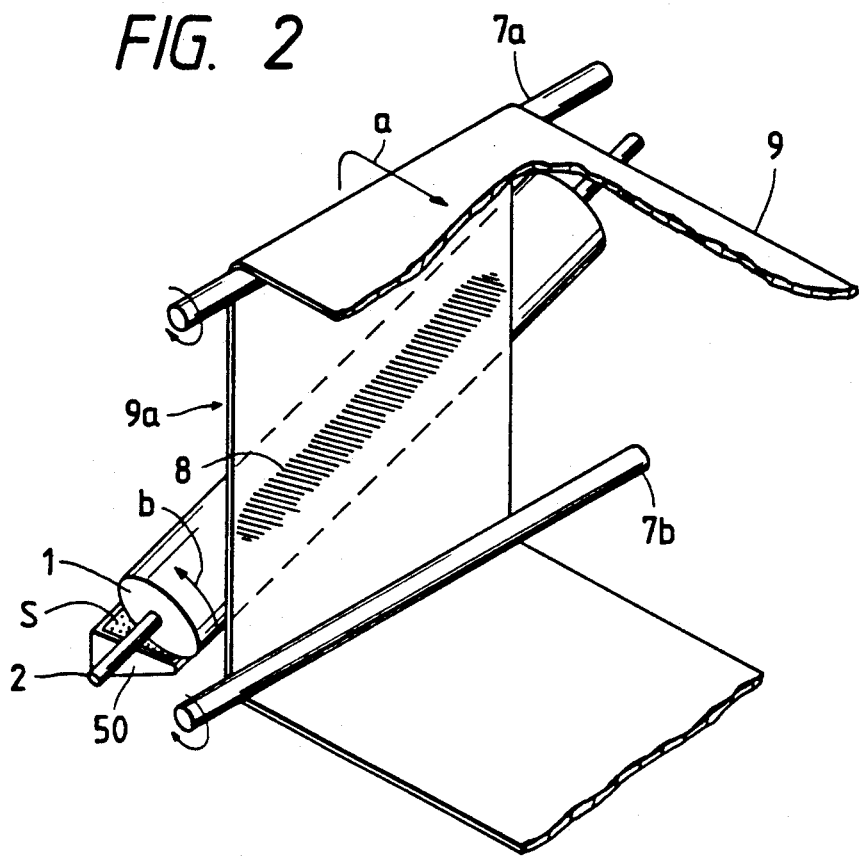
FIG. 2 is a perspective view of the main part of the developer material coating apparatus according to this invention.

FIG. 2 is a perspective view of the main part of the developer material coating apparatus according to this invention.

Figure 1:
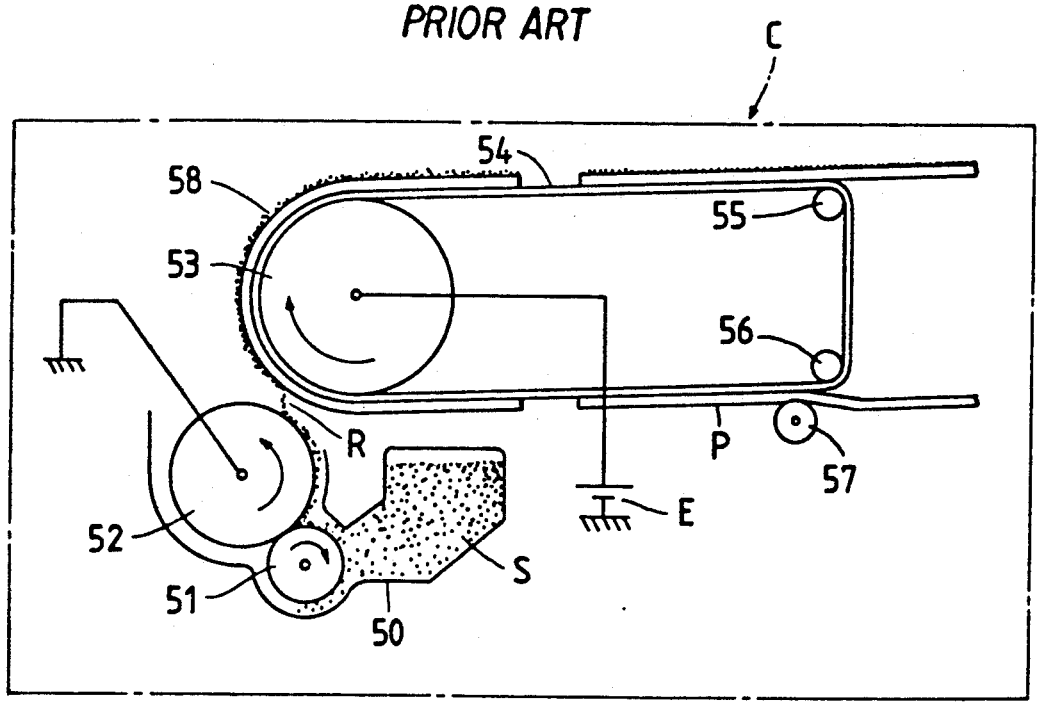
FIG. 1 is a cross-sectional view of a conventional developer material coating apparatus.

In the conventional developer material coating apparatus as shown in FIG. 1, the direction of the longitudinal axis of the carry roller 52 and the feeding direction of the support member P are normal to each other, and this angle relation between both directions is invariable. On the other hand, the developer material coating apparatus according to this invention is designed such that both of the longitudinal direction of the carry roller 52 and the feeding direction of the support member P are not normal, but are obliquely intersected to each other at an arbitrary angle.

Figure 3:
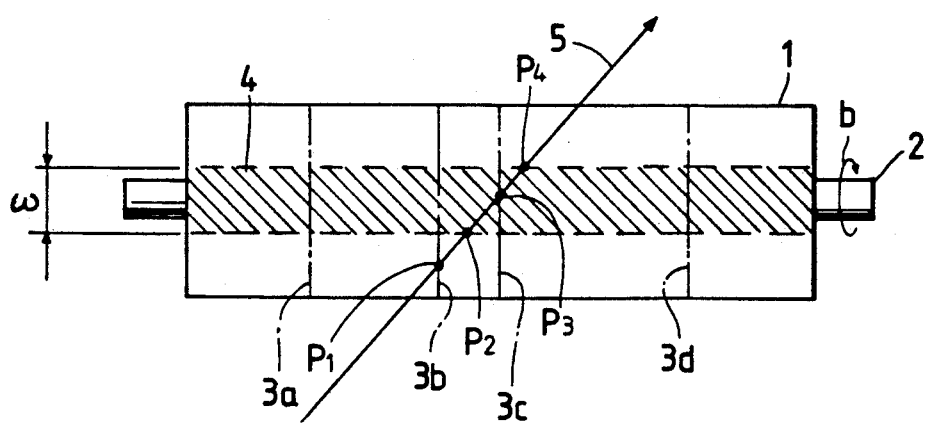
FIG. 3 is an explanatory diagram for explaining the principle of the developer material coating apparatus according to this invention.

FIG. 2 is a perspective view of the main part of the developer material coating apparatus according to this invention, and FIG. 3 is an explanatory diagram for explaining the principle of the developer material coating apparatus according to this invention. In FIGS. 2 and 3, the same elements as those of FIG. 1 are represented by the same reference numerals and the description thereof is eliminated.

In the developer material coating apparatus of this invention, a pair of electrode shafts 7a and 7b are used in place of the counter electrode roller 53. The electrode shafts 7a and 7b are disposed spacedly at a predetermined interval in parallel to each other, and clockwisely rotated as indicated by an arrow of FIG. 2. Further, the electrode shafts 7a and 7b are supplied with a voltage having the opposite polarity to that of the charged developer material charged, the electrode shafts 7a and 7b are supplied with a L positive voltage. Among these electrode shafts 7a and 7b and the pair of guide rollers 55 and 56 is suspended a conductive carry belt 9 serving as a counter electrode. The electrode shafts 7a and 7b are used not only to keep the carry belt 9 at a positive potential, but also to guide both of the carry belt 9 and the support member attached to the carry belt 9.

The carry roller 1 of this embodiment is so disposed as to confront a vertical plane 9a of the carry belt 9 which is defined between the pair of the electrode shafts 7a and 7b. In more detail, the carry roller 1 is disposed such that the longitudinal axis (direction) thereof is parallel to the vertical plane 9a, and is obliquely intersected to the feeding direction of the support member P on the vertical plane 9a as indicated by the arrow a.

The operation of the developer material coating apparatus according to this invention will be described hereunder.

When the carry roller 1 is rotated in a direction as indicated by the arrow b, the granular developer material S is triboelectrically charged through friction between the carry roller 1 and the developer material S, and fed to the developer material coating region 8 while carried on the carry roller 1. With the electric field occurring between the carry roller 1 and the vertical plane 9a of the carry belt 9, the charged developer material S is electrostatically attracted (transferred) to the support member P (not shown) which has been fed to the developer material coating region 8. In this case, the obliquely-intersecting arrangement of the carry roller 1 and the vertical plane 9a of the carry belt 9 as described above brings the following effect.

In this embodiment, the carry roller 1 is clockwisely rotated as indicated by the arrow b of FIG. 2 with the shaft 2 being at the center of the rotation, and a striped coating irregularity of the developer material S as shown by the irregular coating portions 3a to 3d occurs along the peripheral surface of the carry roller 1 (that is, the developer material S is unevenly coated on the peripheral surface of the carry roller 1 in a strip pattern as shown by one-dotted chain line of FIG. 3). The irregular coating of the developer material S means that the developer material in the striped irregular coating portions 3a to 3d on the carry roller 1 is smaller or larger in coating amount than that in the other portions on the carry roller 1. Further, the developer material S is electrostatically transferred only from a developer material transfer portion 4 (having a width of W as indicated by a slanting line of FIG. 3) on the peripheral surface of the carry roller 1 to the support member P on the carry belt 9.

When the support member P is fed in a direction as indicated by an arrow 5, that is, the support member P is passed through the developer material coating region 8 while the feeding direction thereof is obliquely intersected to the direction of the rotation axis of the carry roller 1 at an angle, any point on the support member P is moved to a position P1 confronting the irregular coating portion 3b on the carry roller 1 by an feeding operation of the support member P. The position P1 confronts the irregular coating portion 3b, but does not confront the developer material transfer region 4, so that no developer material S is coated on (transferred to) the support member P at the position P1. Upon a further feeding operation of the support member P, the point on the support member P is further moved to a position P2. At this position P2, the developer material S is evenly coated on the support member P, that is, the irregularity of the developer material S is not transferred to the support member because the position P2 confronts the developer material transfer portion 4, but confronts no coating irregular portion. This regular transference of the developer material to the support member P as described above is continued until the point on the support member P reaches to a position P3. When the point on the support member P reaches the position P3, the developer material S is also unevenly coated on the support member at the position P3 because the position P3 confronts the developer material transfer region 4 and intersects to another irregular coating portion 3c. After the point on the support member P passes over the position P3, the regular transference of the developer material S to the support member P is continued, that is, the developer material S is evenly coated on the support member P until the point on the support member P reaches a position P4. After the point on the support member P passes over the position P4, no developer material S is coated on the support member P because the point on the support member p does not confront the developer material transfer region 4.

As described above, the irregular transference of the developer material S to the point on the support member P is carried out at only the position P3, but the regular transference of the developer material S to the support member P is carried out at the other positions than P3. In other words, the developer material S is evenly coated on the support member P, that is, no irregularity of the developer material occurs on the support member P in the regions between P2 and P3 and between P3 and P4. Accordingly, even though the developer material S is unevenly coated on the support member P at one position (P3), the unevenly coated portion is remedied at the other positions. Therefore, the support member P is wholly evenly coated with the developer material S, that is, an uniform developer material layer is formed on the support member P without irregularity of the developer material S, and then is subjected to the pressure development.

In this embodiment, the carry roller 1 is disposed in such a manner as to be inclined with respect to the vertical plane 9a of the carry roller 9. However, the carry belt 9 itself may be disposed in such a manner as to travel obliquely to the vertical plane 9a of the carry roller 9 to feed the support member P obliquely to the vertical plane 9a.

In the above embodiment, the relation in arrangement between the carry roller and the electrode shafts is fixed once it is determined. However, by providing the developer material coating apparatus as described above with any moving mechanism for moving at least one of the carry roller and the electrode shafts, the relation in the arrangement may be freely varied.

As described above, according to the developer material coating apparatus according to this invention, even though the irregularity of the developer material occurs on the carry roller, the developer material can be evenly coated on the support member without irregularity of the developer material. Therefore, the developer sheet is pressure-developed without irregularity of the developer material on the developer sheet, so that an excellent image having no irregularity in image density is obtained.

What is claimed is:

1. A developer material coating apparatus for electrostatically coating developer material on a support member in a developer material coating region to form a developer sheet, comprising:

developer material coating means for triboelectrically charging the developer material and electrostatically supplying the charged developer material to the support member in the developer material coating region, said developer material coating means including a carry roller rotatable around a rotational axis thereof for carrying thereon and feeding the charged developer material to the developer material coating region; and support member feeding means for feeding the support member to the developer material coating region while carrying the support member thereon, said support member feeding means having a coating plane in the developer material coating region on which the support member is disposed so as to be electrostatically coated with the developer material and a guide unit for feeding the support member along the coating plane in a predetermined feeding direction, and wherein said carry roller is disposed at a predetermined interval away from said coating plane such that the direction of the rotational axis of said carry roller is intersected obliquely at a predetermined angle to the feeding direction of the support member on the coating plane of said support member feeding means.

2. The developer material coating apparatus as claimed in claim 1, wherein said guide unit is adjustably oriented to change the feeding direction of said support member on the coating plane so that the direction of the rotational axis of said carry roller obliquely intersects the feeding direction of the support member on the coating plane.

3. The developer material coating apparatus as claimed in claim 1, wherein said guide unit comprises a pair of spaced rotatable electrode shafts and a carry belt suspended about said electrode shafts for carrying the support member thereon, the coating plane being defined as the surface of said carry belt located about said electrode shafts.

4. The developer material coating apparatus as claimed in claim 3, wherein said electrode shafts are disposed in parallel with each other.

5. A developer material coating apparatus as claimed in claim 3, wherein each of said electrode shafts is supplied with a voltage having the opposite polarity of that of the charged developer material and said carry belt has conductivity, thereby keeping the coating plane at a positive potential and electrostatically attracting the charged developer material toward the coating plane.

6. A developer material coating apparatus for electrostatically coating developer material on a support member in a developer material coating region to form a developer sheet, comprising:
 a pair of rotatable electrode shafts,
 a carry belt suspended between said electrode shafts for carrying thereon and feeding the support member to the developer material coating region by rotation of said electrode rollers; and
 a carry roller rotatable around a rotational axis thereof for triboelectrically charging the developer material and feeding the charged developer material to the developer material coating region while carrying the charged developer material thereon, and wherein said carry roller is disposed at a predetermined interval away from said coating plane such that the direction of the rotational axis of said carry roller is intersected obliquely at a predetermined angle to the feeding direction of the support member of said support member feeding means.

7. An image forming material coating apparatus for electrostatically coating image forming material on a support member in an image forming material coating region to form an image forming sheet, comprising:
 image forming material coating means for triboelectrically charging the image forming material and electrostatically supplying the charged image forming material to the support member in the image forming material coating region, said image forming material coating means including a carry roller rotatable around a rotational axis thereof for carrying thereon and feeding the charged image forming material to the image forming material coating region; and
 support member feeding means for feeding the support member to the image forming material coating region while carrying the support member thereon, said support member feeding means having a coating plane in the image forming material coating region on which the support member is disposed so as to be electrostatically coated with the image forming material and a guide unit for feeding the support member along the coating plane in a predetermined feeding direction, and wherein said carry roller is disposed at a predetermined interval away from said coating plane such that the direction of the rotational axis of said carry roller is intersected obliquely at a predetermined angle to the feeding direction of the support member on the coating plane of said support member feeding means.

8. The image forming material coating apparatus as claimed in claim 7, wherein said guide unit is adjustably oriented to change the feeding direction of said support member on the coating plane so that the direction of the rotational axis of said carry roller obliquely intersects the feeding direction of the support member on the coating plane.

9. The image forming material coating apparatus as claimed in claim 7, wherein said guide unit comprises a pair of spaced rotatable electrode shafts and a carry belt suspended about said electrode shafts for carrying the support member thereon, the coating plane being defined as the surface of said carry belt located about said electrode shafts.

10. The image forming material coating apparatus as claimed in claim 9, wherein said electrode shafts are disposed in parallel with each other.

11. The image forming material coating apparatus as claimed in claim 9, wherein each of said electrode shafts is supplied with a voltage having the opposite polarity of that of the charged image forming material and said carry belt has conductivity, thereby keeping the coating plane at a positive potential and electrostatically attracting the charged image forming material toward the coating plane.

12. An image forming material coating apparatus for electrostatically coating image forming material on a support member in an image forming material coating region to form an image forming sheet, comprising:
 a pair of rotatable electrode shafts,
 a carry belt suspended between said electrode shafts for carrying thereon and feeding the support member to the image forming material coating region by rotation of said electrode rollers; and
 a carry roller rotatable around a rotational axis thereof for triboelectrically charging the image forming material and feeding the charged image forming material to the image forming coating region while carrying the charged image forming material thereon, and wherein said carry roller is disposed at a predetermined interval away from said coating plane such that the direction of the rotational axis of said carry roller is intersected obliquely at a predetermined angle to the feeding direction of the support member of said support member feeding means.

* * * * *